(12) United States Patent
Kang et al.

(10) Patent No.: US 9,319,082 B2
(45) Date of Patent: *Apr. 19, 2016

(54) RECEIVER AND TRANSMITTER OF COPING WITH INTERFERENCE IN SUPER-REGENERATIVE COMMUNICATION SYSTEM, AND METHOD OF USING THE RECEIVER AND THE TRANSMITTER

(71) Applicant: SAMSUNG ELECTRONICS CO., LTD., Suwon-si (KR)

(72) Inventors: Joon Seong Kang, Seoul (KR); Jae Sup Lee, Yongin-si (KR); Hyo Sun Hwang, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/540,508

(22) Filed: Nov. 13, 2014

(65) Prior Publication Data

US 2015/0099471 A1   Apr. 9, 2015

Related U.S. Application Data

(63) Continuation of application No. 13/675,254, filed on Nov. 13, 2012, now Pat. No. 8,913,648.

(30) Foreign Application Priority Data

Nov. 18, 2011   (KR) .................. 10-2011-0121019

(51) Int. Cl.
*H04B 1/12*   (2006.01)
*H04B 1/10*   (2006.01)
*H03D 11/02*   (2006.01)
*H04B 1/24*   (2006.01)
*H04B 7/26*   (2006.01)

(52) U.S. Cl.
CPC .............. *H04B 1/123* (2013.01); *H03D 11/02* (2013.01); *H04B 1/1027* (2013.01); *H04B 1/24* (2013.01); *H04B 7/26* (2013.01)

(58) Field of Classification Search
USPC .................................. 375/219, 316, 346, 350
See application file for complete search history.

(56) References Cited

U.S. PATENT DOCUMENTS 5,105,162 A    4/1992 Fleissner et al.
5,185,585 A *  2/1993 Newell et al. .................. 331/46
(Continued)

OTHER PUBLICATIONS

Chen, Jia-Yi, et al., "A Fully Integrated Auto-Calibrated Super-Regenerative Receiver," ISSCC, 2006, 11 Pages.

*Primary Examiner* — Kabir A Timory
(74) *Attorney, Agent, or Firm* — NSIP Law

(57) ABSTRACT

A receiver and a transmitter that copes with interference in a super-regenerative communication system, and a method of using the receiver and the transmitter, are provided. A super-regenerative receiver includes a resonance frequency adjusting unit configured to adjust a resonance frequency associated with a filtering band of a transmission signal that is received from a transmitter. The super-regenerative receiver further includes an oscillation signal generating unit configured to generate an oscillation signal, using a positive feedback amplification, based on the resonance frequency and the transmission signal. The super-regenerative receiver further includes an oscillation characteristic detecting unit configured to detect a characteristic of the oscillation signal. The super-regenerative receiver further includes a determining unit configured to determine whether interference is included in the transmission signal based on the characteristic of the oscillation signal and the resonance frequency.

20 Claims, 13 Drawing Sheets

(56) References Cited

U.S. PATENT DOCUMENTS

| | | |
|---|---|---|
| 5,946,609 A | 8/1999 | Morey |
| 6,668,165 B1 | 12/2003 | Cloutier |
| 7,215,936 B2 | 5/2007 | Sadowski |
| 7,848,384 B2 | 12/2010 | Pelissier et al. |
| 8,166,084 B2 | 4/2012 | Hahn et al. |
| 2002/0063604 A1* | 5/2002 | Goldman .................. 331/34 |
| 2004/0198288 A1 | 10/2004 | Sadowski |
| 2009/0016548 A1 | 1/2009 | Monat et al. |
| 2010/0289591 A1 | 11/2010 | Garcia |
| 2012/0329415 A1 | 12/2012 | Ruijter |

* cited by examiner

RECEIVER AND TRANSMITTER OF COPING WITH INTERFERENCE IN SUPER-REGENERATIVE COMMUNICATION SYSTEM, AND METHOD OF USING THE RECEIVER AND THE TRANSMITTER

CROSS-REFERENCE TO RELATED APPLICATION(S)

This application is a Continuation of U.S. patent application Ser. No. 13/675,254 filed on Nov. 13, 2012, which claims the benefit under 35 U.S.C. §119(a) of Korean Patent Application No. 10-2011-0121019, filed on Nov. 18, 2011, in the Korean Intellectual Property Office, the entire disclosure of which is incorporated herein by reference for all purposes.

BACKGROUND

1. Field

The following description relates to a receiver and a transmitter that copes with interference in a super-regenerative communication system, and a method of using the receiver and the transmitter.

2. Description of Related Art

A super-regenerative receiver may generate an oscillation signal from a received signal using a positive feedback amplification scheme. The super-regenerative receiver may obtain a relatively high signal gain with a relatively small number of elements. The positive feedback amplification scheme may adjust a phase of an output signal of an amplifier to be identical to a phase of an input signal of the amplifier, and may reapply the phase-adjusted output signal of the amplifier to an input of the amplifier.

SUMMARY

In one general aspect, there is provided a super-regenerative receiver including a resonance frequency adjusting unit configured to adjust a resonance frequency associated with a filtering band of a transmission signal that is received from a transmitter. The super-regenerative receiver further includes an oscillation signal generating unit configured to generate an oscillation signal, using a positive feedback amplification, based on the resonance frequency and the transmission signal. The super-regenerative receiver further includes an oscillation characteristic detecting unit configured to detect a characteristic of the oscillation signal. The super-regenerative receiver further includes a determining unit configured to determine whether interference is included in the transmission signal based on the characteristic of the oscillation signal and the resonance frequency.

The super-regenerative receiver further includes a control unit configured to control the resonance frequency adjusting unit to adjust the resonance frequency based on a determination result of the determining unit.

The super-regenerative receiver further includes a control signal transmitting unit configured to transmit, to the transmitter, a control signal associated with a strength of the transmission signal based on a determination result of the determining unit.

The super-regenerative receiver further includes a control unit configured to control the resonance frequency adjusting unit to adjust the resonance frequency based on a determination result of the determining unit. The super-regenerative receiver further includes a control signal transmitting unit configured to transmit, to the transmitter, a control signal associated with a characteristic of the transmission signal based on the determination result.

The characteristic of the transmission signal includes a strength of the transmission signal and/or a transmission frequency of the transmission signal.

The super-regenerative receiver further includes a selecting unit configured to select a scheme from among schemes associated with control of the oscillation signal based on a determination result of the determining unit, or the characteristic of the oscillation signal, or a control result of the oscillation signal generated by a previous selection of one of the schemes, or any combination thereof. The super-regenerative receiver further includes a control unit configured to control the resonance frequency adjusting unit to adjust the resonance frequency based on the scheme. The super-regenerative receiver further includes a control signal transmitting unit configured to transmit, to the transmitter, a control signal associated with a characteristic of the transmission signal based on the scheme.

In a first scheme among the schemes, the control unit is further configured to control the resonance frequency adjusting unit to adjust the resonance frequency. In a second scheme among the schemes, the control signal transmitting unit is further configured to transmit, to the transmitter, the control signal associated with a strength of the transmission signal. In a third scheme among the schemes, the control signal transmitting unit is further configured to transmit, to the transmitter, the control signal associated with a transmission frequency of the transmission signal, and the control unit is further configured to control the resonance frequency adjusting unit to adjust the resonance frequency.

The characteristic of the oscillation signal includes a frequency of the oscillation signal, or a type of the oscillation signal, or a strength of the oscillation signal at a point in time in which a predetermined period of time is elapsed after an oscillation starts, or any combination thereof.

To determine whether the interference is included in the transmission signal, the determining unit is further configured to determine whether injection locking or injection pulling occurs based on the resonance frequency and the frequency of the oscillation signal.

The oscillation signal generating unit includes a resonator configured to generate the oscillation signal, an amplifier configured to generate an output signal based on an amplification gain of the amplifier and the oscillation signal, and an amplification gain adjusting unit configured to adjust the amplification gain. The resonator is further configured to generate the oscillation signal based on the resonance frequency, the transmission signal, and the output signal.

The super-regenerative receiver further includes a receive status transmitting unit configured to transmit, to the transmitter, information associated with a receive status of the super-regenerative receiver based on a determination result of the determining unit.

The super-regenerative receiver further includes a control signal receiving unit configured to receive, from the transmitter, a control signal associated with a characteristic of the transmission signal, and a control unit configured to control the resonance frequency adjusting unit to adjust the resonance frequency based on the control signal.

In another general aspect, there is provided a transmitter used in a super-regenerative communication system including a super-regenerative receiver, including a transmission signal characteristic adjusting unit configured to adjust a characteristic of a transmission signal. The transmitter further includes a control signal receiving unit configured to receive, from the super-regenerative receiver, a control signal associated with the characteristic of the transmission signal. The transmitter further includes a control unit configured to control the transmission signal characteristic adjusting unit to adjust the characteristic of the transmission signal based on the control signal. The super-regenerative receiver is configured to determine whether interference is included in the transmission signal that is received from the transmitter, and to generate the control signal based on a determination result of the super-regenerative receiver.

The characteristic of the transmission signal includes a strength of the transmission signal and/or a transmission frequency of the transmission signal.

In yet another general aspect, there is provided a transmitter used in a super-regenerative communication system including a super-regenerative receiver, including a transmission signal characteristic adjusting unit configured to adjust a characteristic of a transmission signal. The transmitter further includes a receive status receiving unit configured to receive, from the super-regenerative receiver, information associated with a receive status of the super-regenerative receiver. The transmitter further includes a control unit configured to control the transmission signal characteristic adjusting unit to adjust the characteristic of the transmission signal based on the information associated with the receive status. The super-regenerative receiver is configured to determine whether interference is included in the transmission signal that is received from the transmitter, and to generate the information associated with the receive status based on a determination result of the super-regenerative receiver.

The transmitter further includes a control signal transmitting unit configured to transmit, to the super-regenerative receiver, a control signal associated with the characteristic of the transmission signal. The control unit is further configured to control the control signal transmitting unit to transmit the control signal.

In still another general aspect, there is provided a method of controlling an oscillation signal in a super-regenerative receiver, including receiving, from a transmitter, a transmission signal. The method further includes adjusting a resonance frequency associated with a filtering band of the transmission signal. The method further includes generating an oscillation signal, using a positive feedback amplification, based on the resonance frequency and the transmission signal. The method further includes detecting a characteristic of the oscillation signal. The method further includes determining whether interference is included in the transmission signal based on the characteristic of the oscillation signal and the resonance frequency.

The method further includes controlling the resonance frequency based on the determining of whether the interference is included, and/or transmitting, to the transmitter, a control signal associated with a characteristic of the transmission signal based on the determining of whether the interference is included. The characteristic of the transmission signal includes a strength of the transmission signal and/or a transmission frequency of the transmission signal.

The method further includes selecting a scheme from among schemes associated with control of the oscillation signal based on the determining of whether the interference is included, or the characteristic of the oscillation signal, or a control result of the oscillation signal generated by a previous selection of one of the schemes, or any combination thereof. The method further includes controlling the oscillation signal based on the scheme. The schemes include a scheme of adjusting the resonance frequency, a scheme of transmitting, to the transmitter, a control signal associated with a strength of the transmission signal, and a scheme of transmitting, to the transmitter, a control signal associated with a transmission frequency of the transmission signal and adjusting the resonance frequency.

A non-transitory computer-readable storage medium storing a program includes instructions to cause a computer to perform the method.

Other features and aspects will be apparent from the following detailed description, the drawings, and the claims.

BRIEF DESCRIPTION OF THE DRAWINGS

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. The progression of processing steps and/or operations described is an example; however, the sequence of and/or operations is not limited to that set forth herein and may be changed known in the art, with the exception of steps and/or operations necessarily occurring in a certain order. Also, description of well-known functions and constructions may be omitted for increased clarity and conciseness.

Figure 1:
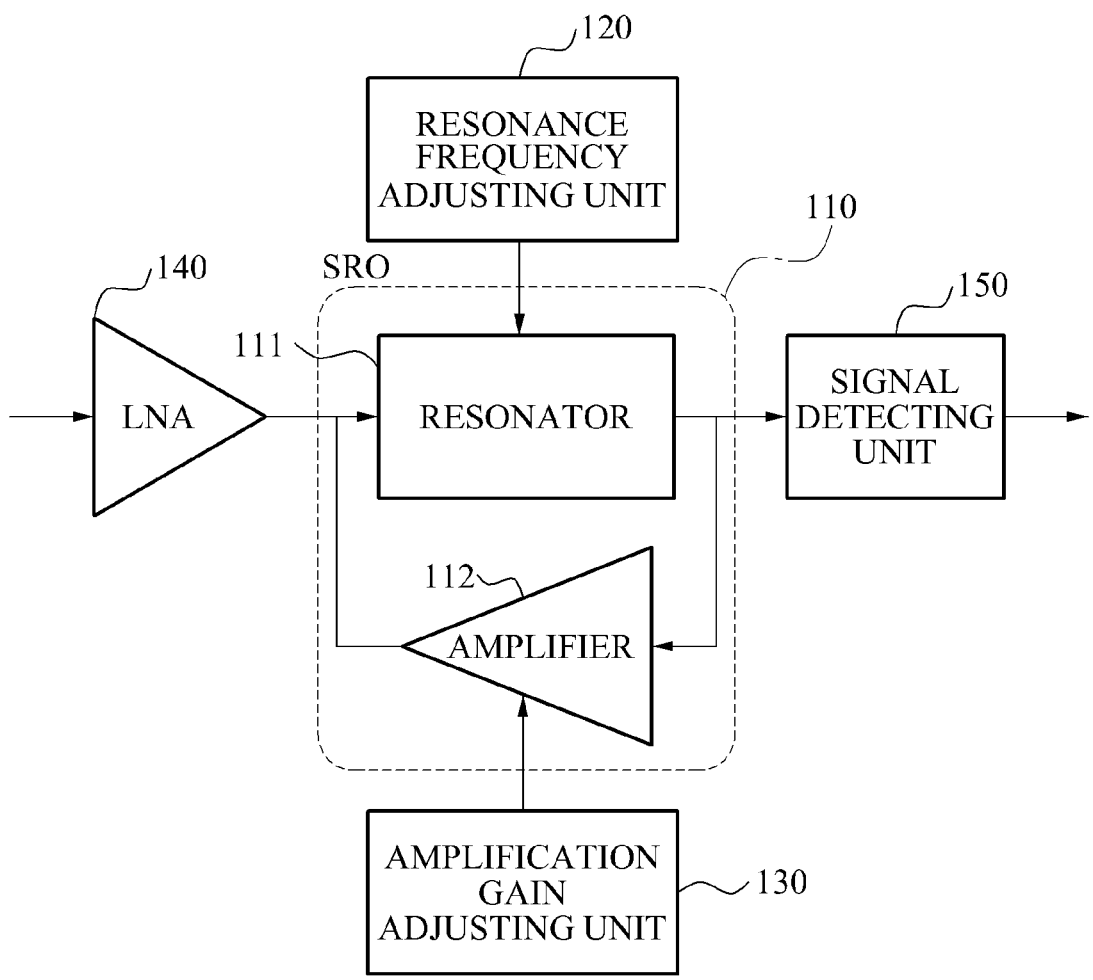
FIG. 1 is a diagram illustrating an example of a super-regenerative receiver.

FIG. 1 illustrates an example of a super-regenerative receiver (SRR). The SRR includes a super-regenerative oscillator (SRO) 110, a resonance frequency adjusting unit 120, an amplification gain adjusting unit 130, a low noise amplifier (LNA) 140, and a signal detecting unit 150.

The SRO 110 includes a resonator 111 and an amplifier 112. The resonance frequency adjusting unit 120 adjusts a resonance frequency of the resonator 111, and the amplification gain adjusting unit 130 adjusts an amplification gain of the amplifier 112. The LNA 140 amplifies a signal that is transmitted from a transmitter (not shown), and the signal detecting unit 150 detects an output signal of the SRO 110.

An output of the resonator 111 is provided to the amplifier 112, and an output of the amplifier 112 is fed back to the resonator 111. The resonator 111 and the amplifier 112 generate an oscillation signal from the signal transmitted from the transmitter, using a positive feedback amplification scheme. An oscillation frequency of the generated oscillation signal may be dependent on a capacitance C and an inductance L of the resonator 111.

For example, the SRO 110 is an oscillator that includes the amplification gain adjusting unit 130 capable of adjusting the amplification gain of the amplifier 112. Using the SRO 110, the SRR receives and detects the signal transmitted from the transmitter.

Figure 2:
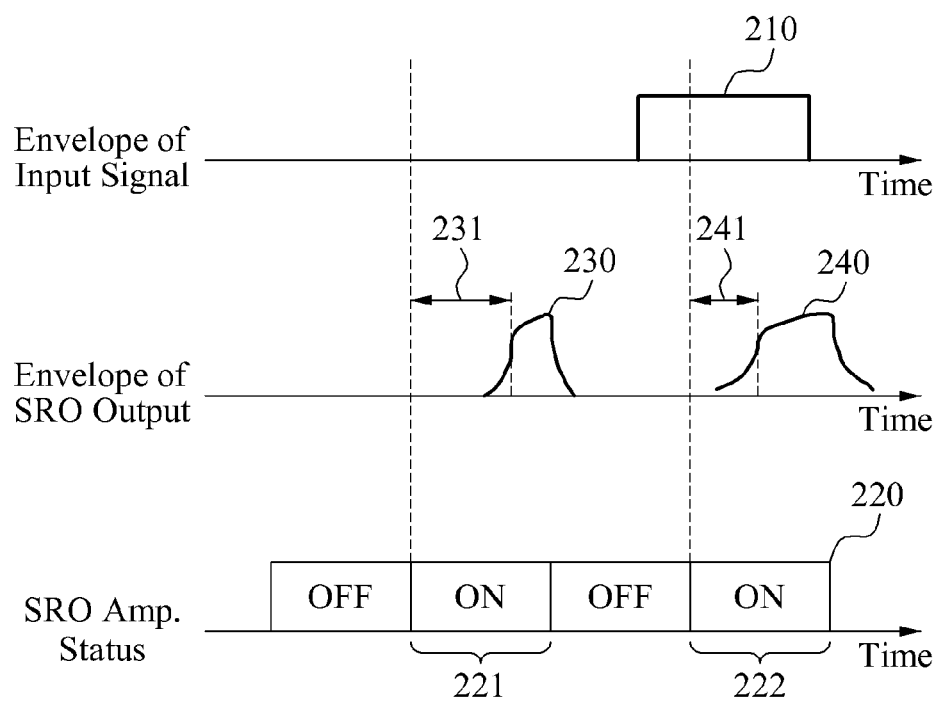
FIG. 2 is a diagram illustrating an example of an operation of a super-regenerative receiver.

FIG. 2 illustrates an example of an operation of an SRR. The SRR applies a received signal 210 (e.g., an input signal) to an SRO (e.g., the SRO 110 in FIG. 1) as an initial status signal, and generates oscillation signals 230 and 240 (e.g., an SRO output) from the received signal 210, using a positive feedback amplification scheme. When amplification starts, each of the oscillation signals 230 and 240 output by the SRO may have an exponentially growing shape, as shown in plots 230 and 240, respectively.

A shape of an oscillation signal may vary based on an initial status signal at a start point in a time of amplification. For example, a strength (e.g., amplitude) of the initial status signal (the received signal 210) at a start point in a time of amplification in a second time interval 222 is greater than a strength of the initial status signal at a start point in a time of amplification in a first time interval 221. In this example, the oscillation signal 240 generated in the second time interval 222 is generated more quickly and with a greater time length in comparison to the oscillation signal 230 generated in the first time interval 221. The SRR may detect a transmission signal based on a rate at which an oscillation signal is generated, a strength (e.g., amplitude) of the generated oscillation signal, and/or the like.

As shown in an SRO amplifier status 220, the SRR periodically turns on or off an amplification gain of an amplifier (e.g., the amplifier 112 in FIG. 1) of the SRO, using an amplification gain adjusting unit (e.g., the amplification gain adjusting unit 130). The SRR generates the oscillation signals 230 and 240 from the received signal 210, using the positive feedback amplification scheme. Therefore, even in the case of the weak received signal 210 at the start point in the time of amplification in the first time interval 221, when a predetermined period of time 231 is elapsed after the start point, the oscillation signal 230, having a sufficient strength to be detected by the SRR, is generated. When a predetermined period of time 241 is elapsed after the start point in the time of amplification in the second time interval 222, the oscillation signal 240 is generated.

In addition, the generated oscillation signal 230 is reapplied to an input of the amplifier, using the positive feedback amplification scheme. Accordingly, once an oscillation signal is generated, the generated oscillation signal does not disappear. However, a signal detecting unit (e.g., the signal detecting unit 150 in FIG. 1) included in the SRO may not be able to identify signals that are newly-received after the oscillation signal is generated.

Accordingly, using the amplification gain adjusting unit, the SRR enables the generated oscillation signal to disappear by periodically turning off the amplification gain of the amplifier, as shown in the SRO amplifier status 220. In this example, the signal detecting unit may be able to detect a signal that is newly-received in a subsequent interval in which the amplification gain is turned on.

Figure 3:
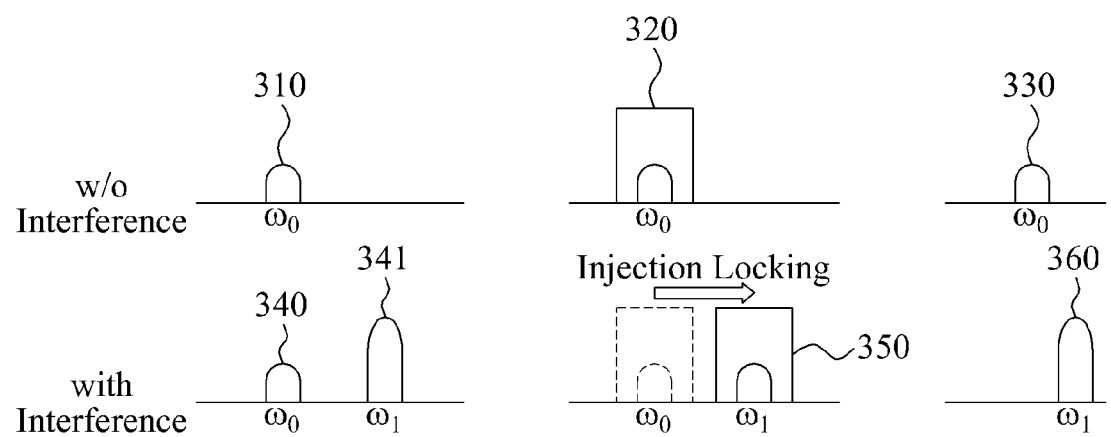
FIG. 3 is a diagram illustrating an example of injection locking.

FIG. 3 illustrates an example of injection locking. A signal received by an SRR may be directly applied to an oscillator, and thus, injection locking or injection pulling may occur due to the signal being an interference signal. In the case of injection locking, when an interference signal having a different frequency $\omega_1$ is input into the oscillator oscillating at a resonance frequency $\omega_0$ of a resonator, the resonance frequency $\omega_0$ may be changed to the interference signal frequency $\omega_1$. In the case of injection pulling, when an interference signal having the different frequency $\omega_1$ is input into the oscillator oscillating at the resonance frequency $\omega_0$ of the resonator, the resonance frequency $\omega_0$ may be changed to another different frequency $\omega_2$.

For example, when a different interference signal having a relatively high signal strength (e.g., amplitude) and a frequency $\omega_1$ is input into the SRR designed to receive and react to a signal of a predetermined frequency, for example, $\omega_0$, a resonance frequency of a SRO of the SRR may be changed, for example, from $\omega_0$ to $\omega_1$ or $\omega_2$. In this example, the SRR may react to a signal of a different frequency band instead of reacting to a signal of a desired frequency band, and may generate an oscillation signal with respect to the signal of the other frequency band. A probability of injection locking or injection pulling occurring may increase according to an increase in a strength (e.g., amplitude) of an interference signal, or a decrease in an interval between a resonance frequency and a center frequency of the interference signal, for example, $\Delta\omega=\omega_0-\omega_1$.

For example, when the SRR receives a signal 310 that does not include interference, a resonance frequency $\omega_0$ of the SRO included in the SRR is not varied. As a result, a filtering bandwidth 320 of the SRR using the resonance frequency $\omega_0$ as a center frequency is not varied, and thus, the SRR generates and detects an oscillation signal 330 that is not varied with respect to the received signal 310.

On the contrary, when the SRR receives a signal 340 and an interference signal 341, injection locking occurs. In this example, a resonance frequency $\omega_0$ of the SRO included in the SRR is changed to a center frequency $\omega_1$ of the interference signal 341. As a result, a filtering bandwidth 350 of the SRR is changed to use the center frequency $\omega_1$ as a center frequency, and thus, the SRR generates and detects an oscillation signal 360 associated with the interference signal 341 of a different frequency band, instead of the signal 340 of a desired frequency band.

Figure 4:
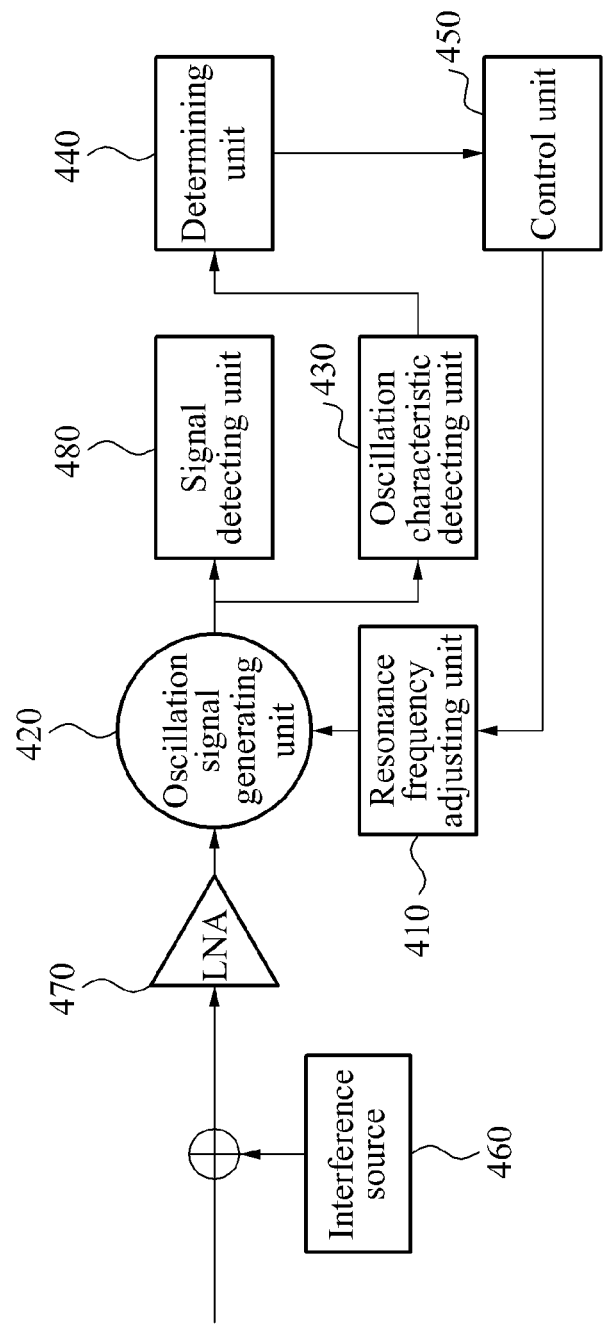
FIG. 4 is a diagram illustrating an example of a super-regenerative receiver configured to control an oscillation signal by adjusting a resonance frequency.

FIG. 4 illustrates an example of an SRR configured to control an oscillation signal by adjusting a resonance frequency. The SRR includes a resonance frequency adjusting unit 410 configured to adjust a resonance frequency associated with a filtering band of a signal that is received from a transmitter. The SRR further includes an oscillation signal generating unit 420 configured to generate an oscillation signal, using a positive feedback amplification scheme, based on the resonance frequency and the received signal.

For example, the oscillation signal generating unit 420 may include a resonator, an amplifier, and an amplification gain adjusting unit configured to adjust an amplification gain of the amplifier. The resonator may generate a resonance signal based on the resonance frequency, the received signal, and an output signal of the amplifier. The amplifier may generate the output signal based on the amplification gain and the resonance signal. Description related to the SRO made above with reference to FIG. 1 and FIG. 2 may be applied to each of the resonance frequency adjusting unit 410 and the oscillation signal generating unit 420, and thus, further detailed description will be omitted here.

The SRR further includes an oscillation characteristic detecting unit 430 configured to detect a characteristic of the oscillation signal. For example, the characteristic of the oscillation signal may include a frequency of the oscillation signal, a type of the oscillation signal, and/or a strength (e.g., amplitude) of the oscillation signal at a point in time in which a predetermined period of time is elapsed after oscillation starts.

The SRR further includes a determining unit 440 configured to determine whether an interference signal from an interference source 460 is included in the received signal from the transmitter based on the characteristic of the oscillation signal and the resonance frequency. To determine whether the interference signal is included in the received signal, the determining unit 440 determines whether injection locking or injection pulling occurs based on the resonance frequency and the frequency of the oscillation signal.

For example, the determining unit 440 may recognize a difference between an initially set resonance frequency $\omega_0$ of the resonator and an actual oscillation frequency $\omega_1$, and may determine that injection locking or injection pulling occurs based on the difference. In more detail, when injection locking or injection pulling occurs, $\omega_0$ and $\omega_1$ may have different values. On the contrary, when injection locking or injection pulling does not occur, $\omega_0$ and $\omega_1$ may have the same value. The determining unit 440 may determine whether injection locking or injection pulling occurs by comparing $\omega_0$ and $\omega_1$.

The SRR further includes a control unit 450 configured to control the resonance frequency adjusting unit 410 to adjust the resonance frequency based on the determination result of the determining unit 440. A probability of injection locking or injection pulling occurring may increase according to a decrease in an interval between a resonance frequency of the SRO and a center frequency of an interference signal, for example, $\Delta\omega=\omega_0-\omega_1$. Accordingly, the control unit 450 controls the resonance frequency adjusting unit 410 to adjust the resonance frequency of the SRO so that the interval between the resonance frequency of the SRO and the center frequency of the interference signal increases. Description related to the adjustment of the resonance frequency and the control of the oscillation signal through the adjustment of the resonance frequency will be further described with reference to FIG. 5.

The SRR further includes an LNA 470 configured to amplify the signal received from the transmitter and to provide the amplified signal to the oscillation signal generating unit 420. The SRR further includes a signal detecting unit 480 configured to detect an output signal of the oscillation signal generating unit 420.

Figure 5:
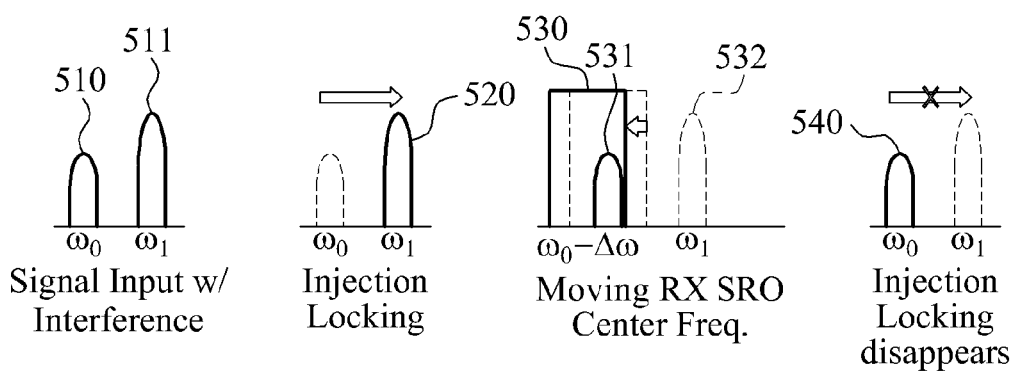
FIG. 5 is a diagram illustrating an example of a process of controlling, by a super-regenerative receiver, an oscillation signal by adjusting a resonance frequency.

FIG. 5 illustrates an example of a process of controlling, by an SRR, an oscillation signal by adjusting a resonance frequency. When the SRR receives a signal 510 and an interference signal 511, injection locking or injection pulling may occur. As a result, the SRR may generate and detect an oscillation signal 520 associated with the interference signal 511 of a different frequency band, instead of the signal 510 of a desired frequency band. The SRR may prevent the occurrence of injection locking or injection pulling by adjusting a resonance frequency $\omega_0$ associated with a filtering band of the signal 510 in order to generate an oscillation signal associated with the signal 510 of the desired frequency band.

For example, a probability of injection locking or injection pulling occurring may increase according to a decrease in an interval between a resonance frequency of an SRO and a center frequency of an interference signal. Therefore, a control unit (e.g., the control unit 450 in FIG. 4) included in the SRR may control a resonance frequency adjusting unit to adjust the resonance frequency of the SRO so that the interval between the resonance frequency of the SRO and the center frequency of the interference signal increases.

For example, a determining unit (e.g., the determining unit 440 in FIG. 4) included in the SRR determines that injection locking or injection pulling has occurred based on the interference signal 520 of the frequency band different from the desired frequency band, being detected. The control unit included in the SRR controls the resonance frequency adjusting unit to adjust the resonance frequency $\omega_0$ associated with a filtering band of the signal 510 to a resonance frequency $\omega_0-\Delta\omega$ associated with a filtering band of a signal 531, which is further away from a center frequency $\omega_1$ of an interference signal 532. As a result, a filtering bandwidth 530 of the SRR (e.g., RX SRO) using the adjusted resonance frequency $\omega_0-\Delta\omega$ as a center frequency has been adjusted to be further away from the center frequency $\omega_1$ of the interference signal 532.

Here, the control unit may determine the signal 531 of a desired frequency band so that the signal 531 may be detected. For example, the control unit may control the resonance frequency adjusting unit to adjust the resonance frequency $\omega_0$ and the filtering bandwidth 530 within a receivable frequency range of the SRR. When an issue of injection locking or injection pulling is solved by the control of the oscillation signal, the SRR generates and detects an oscillation signal 540 that is not varied with the signal 531 of the desired frequency band.

Figure 6:
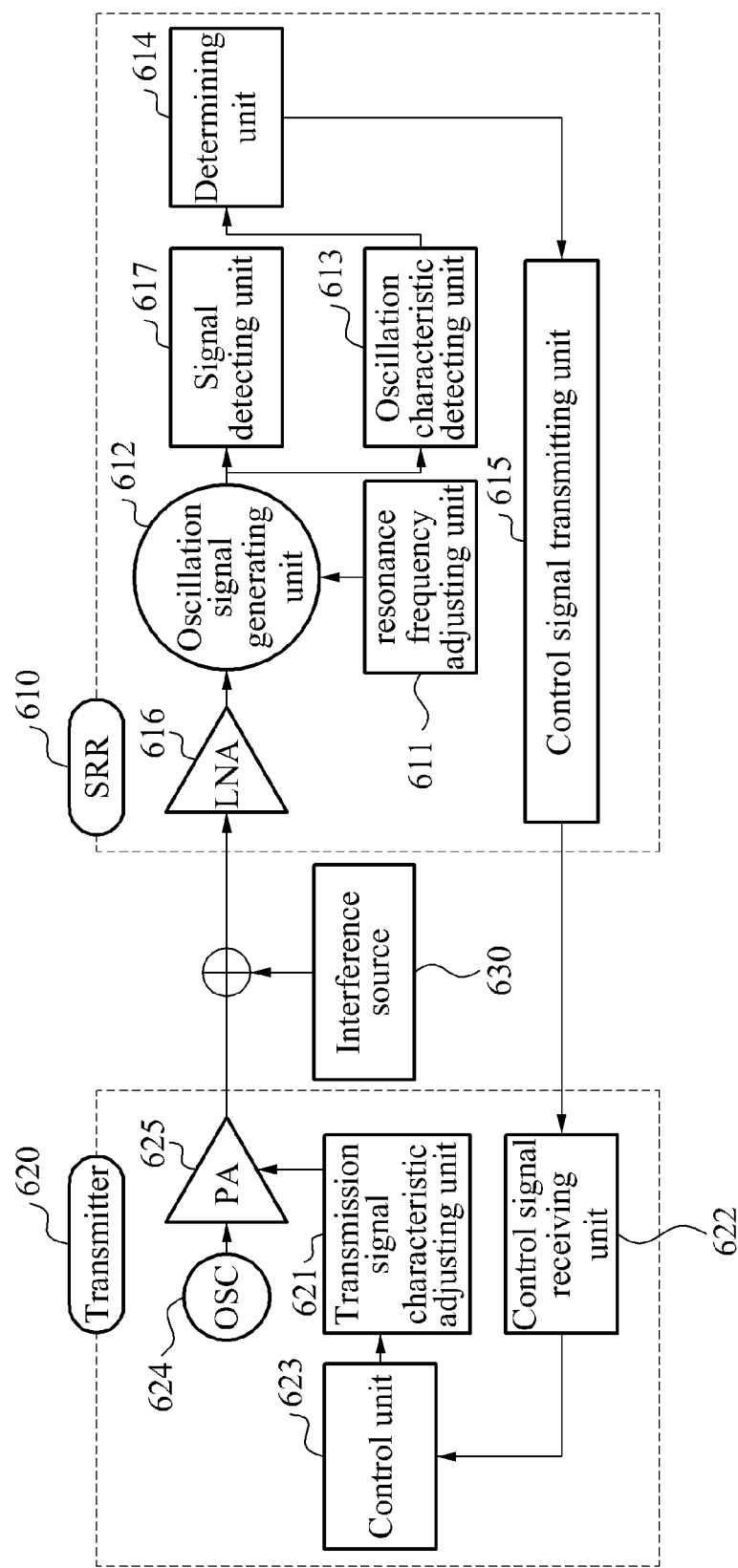
FIG. 6 is a diagram illustrating an example of a super-regenerative receiver and a transmitter used in a super-regenerative communication system, configured to control an oscillation signal by adjusting a strength of a transmission signal.

FIG. 6 illustrates an example of an SRR 610 and a transmitter 620 used in a super-regenerative communication system, configured to control an oscillation signal by adjusting a strength of a transmission signal. The SRR 610 includes a resonance frequency adjusting unit 611 configured to adjust a resonance frequency associated with a filtering band of a transmission signal that is transmitted from the transmitter 620. The SRR 610 further includes an oscillation signal generating unit 612 configured to generate an oscillation signal, using a positive feedback amplification scheme, based on the resonance frequency and the transmission signal. The SRR 610 further includes an oscillation characteristic detecting unit 613 configured to detect a characteristic of the oscillation signal, and a determining unit 614 configured to determine whether an interference signal from an interference source 630 is included in the transmission signal based on the characteristic of the oscillation signal and the resonance frequency.

The SRR 610 further includes an LNA 616 configured to amplify the transmission signal transmitted from the transmitter 620, and to provide the amplified signal to the oscillation signal generating unit 612. The SRR 610 further includes a signal detecting unit 617 configured to detect an output signal of the oscillation signal generating unit 612. Description made above with reference to FIG. 4 may be applied to each of the modules, and thus, further description will be omitted here.

The SRR 610 further includes a control signal transmitting unit 615 configured to transmit, to the transmitter 620, a control signal associated with a characteristic of the transmission signal based on the determination result of the determining unit 614. The characteristic of the transmission signal may include, for example, a strength (e.g., amplitude) of the transmission signal.

A probability of injection locking or injection pulling occurring may increase according to a decrease in a ratio of a signal strength of a desired frequency band to a strength of an interference signal, for example, a signal-to-interference ratio (SIR). Therefore, to increase the SIR, the control signal transmitting unit 615 transmits, to the transmitter 620, the control signal instructing the transmitter 620 to increase the strength of the transmission signal that is transmitted from the transmitter 620. Further, when the oscillation signal is determined to be controlled due to transmission of the control signal, for example, when the transmission signal of the desired frequency band is determined to be normally-oscillated and detected, the control signal transmitting unit 615 may report to the transmitter 620 about the control result of the oscillation signal, a current receive status of the SRR 610, and/or the like.

The transmitter 620 includes a transmission signal characteristic adjusting unit 621 configured to adjust the characteristic of the transmission signal. The transmitter 620 further includes a control signal receiving unit 622 configured to receive, from the SRR 610, the control signal associated with the characteristic of the transmission signal. The transmitter 620 further includes a control unit 623 configured to control the transmission signal characteristic adjusting unit 621 to adjust the characteristic of the transmission signal based on the control signal.

In this example, the control signal receiving unit 622 receives, from the control signal transmitting unit 615 of the SRR 610, the control signal associated with the strength of the transmission signal. The control unit 623 controls the transmission signal characteristic adjusting unit 621 to adjust the strength of the transmission signal based on the control signal associated with the strength of the transmission signal. The adjustment of the transmission signal strength and the control of the oscillation signal through the adjustment of the transmission signal strength will be further described with reference to FIG. 7.

The transmitter 620 further includes an oscillator 624 configured to be a frequency source for the transmission signal. The transmitter 620 further includes a power amplifier 625 configured to amplify power of the transmission signal.

Figure 7:
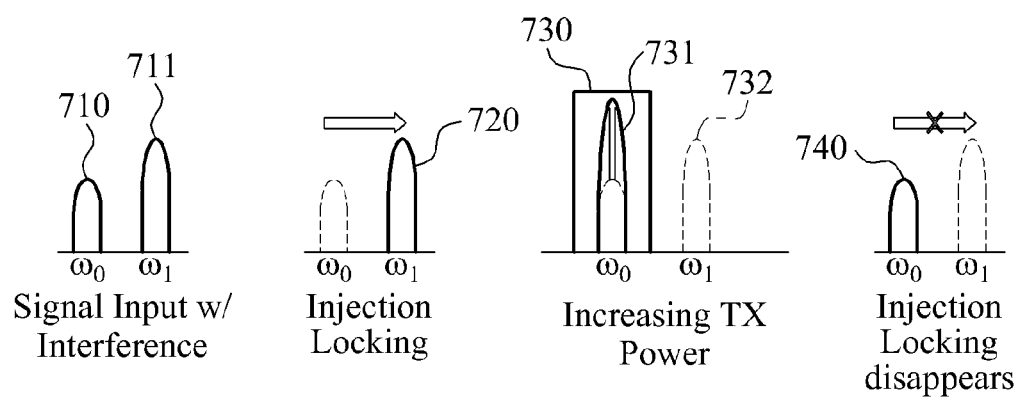
FIG. 7 is a diagram illustrating an example of a process of controlling, by a super-regenerative receiver and a transmitter used in a super-regenerative communication system, an oscillation signal by adjusting a strength of a transmission signal.

FIG. 7 illustrates an example of a process of controlling, by an SRR and a transmitter used in a super-regenerative communication system, an oscillation signal by adjusting a strength of a transmission signal. When the SRR receives a transmission signal 710 and an interference signal 711, injection locking or injection pulling may occur. As a result, the SRR may generate and detect an oscillation signal 720 associated with the interference signal 711 of a different frequency band, instead of the transmission signal 710 of a desired frequency band. The SRR may prevent the occurrence of injection locking or injection pulling by instructing the transmitter to adjust a strength (e.g., amplitude or power) of the transmission signal 710 in order to generate an oscillation signal associated with the transmission signal 710 of the desired frequency band.

For example, a probability of injection locking or injection pulling occurring may increase according to a decrease in an SIR. Accordingly, a control signal transmitting unit (e.g., the control signal transmitting unit 615 in FIG. 6) included in the SRR may transmit a control signal associated with the strength of the transmission signal to the transmitter. The transmitter used in the super-regenerative communication system may receive the control signal, and may increase an SIR of the SRR by adjusting the strength of the transmission signal based on the received control signal.

For example, a determining unit (e.g., the determining unit 614 in FIG. 6) included in the SRR determines that injection locking or injection pulling has occurred based on the interference signal 720 of the frequency band different from the desired frequency band, being detected. In this example, the control signal transmitting unit included in the SRR transmits, to the transmitter, the control signal instructing the transmitter to adjust the strength of the transmission signal 710 to a strength of a transmission signal 731 of the desired frequency band that is greater than a strength of an interference signal 732. In this case, a filtering bandwidth 730 of the SRR using a resonance frequency $\omega_0$ of an SRO as a center frequency is not varied. When an issue of injection locking or injection pulling is solved by the control of the oscillation signal using the control signal, the SRR generates and detects an oscillation signal 740 associated with the transmission signal 731 of the desired frequency band.

Figure 8:
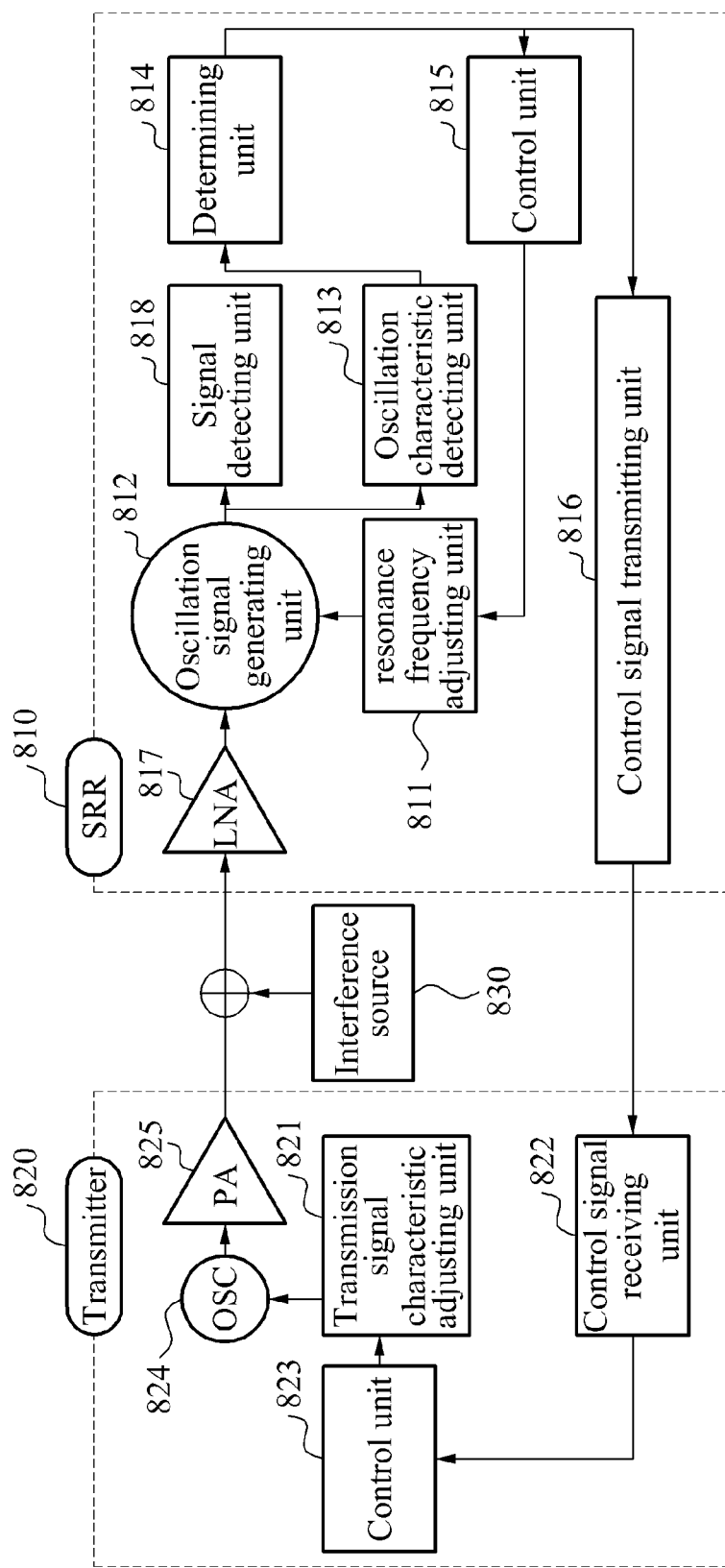
FIG. 8 is a diagram illustrating an example of a super-regenerative receiver and a transmitter used in a super-regenerative communication system, configured to control an oscillation signal by adjusting a transmission frequency of a transmission signal.

FIG. 8 illustrates an example of an SRR 810 and a transmitter 820 used in a super-regenerative communication system, configured to control an oscillation signal by adjusting a transmission frequency of a transmission signal. The SRR 810 includes a resonance frequency adjusting unit 811 configured to adjust a resonance frequency associated with a filtering band of a transmission signal that is transmitted from the transmitter 820. The SRR 810 further includes an oscillation signal generating unit 812 configured to generate an oscillation signal, using a positive feedback amplification scheme, based on the resonance frequency and the transmission signal. The SRR 810 further includes an oscillation characteristic detecting unit 813 configured to detect a characteristic of the oscillation signal, and a determining unit 814 configured to determine whether an interference signal from an interference source 830 is included in the transmission signal based on the characteristic of the oscillation signal and the resonance frequency.

The SRR 810 further includes an LNA 817 configured to amplify the transmission signal transmitted from the transmitter 820, and to provide the amplified signal to the oscillation signal generating unit 812. The SRR 810 further includes a signal detecting unit 818 configured to detect an output signal of the oscillation signal generating unit 812. Description made above with reference to FIG. 4 may be applied to each of the modules, and thus, further description will be omitted here.

The SRR 810 further includes a control unit 815 configured to control the resonance frequency adjusting unit 811 to adjust the resonance frequency based on the determination result of the determining unit 814. The SRR 810 further includes a control signal transmitting unit 816 configured to transmit, to the transmitter 820, a control signal associated with a characteristic of the transmission signal. Here, the characteristic of the transmission signal may include, for example, a transmission frequency of the transmission signal.

A probability of injection locking or injection pulling occurring may increase according to a decrease in an interval $\Delta\omega$ between a resonance frequency associated with a filtering band of a transmission signal and a center frequency of an interference signal. Accordingly, the control signal transmitting unit 816 transmits, to the transmitter 820, the control signal instructing the transmitter 820 to adjust the transmission frequency of the transmission signal transmitted from the transmitter 820, so that the interval $\Delta\omega$ increases. Also, the control unit 815 controls the resonance frequency adjusting unit 811 to adjust the resonance frequency in order to receive the transmission signal with the adjusted transmission frequency. Further, when the oscillation signal is determined to be controlled due to transmission of the control signal, for example, when the transmission signal of the desired frequency band is determined to be normally-oscillated and detected, the control signal transmitting unit 816 may report to the transmitter 820 about the control result of the oscillation signal, a current receive status of the SRR 810, and/or the like.

The transmitter 820 includes a transmission signal characteristic adjusting unit 821 configured to adjust the characteristic of the transmission signal. The transmitter 820 further includes a control signal receiving unit 822 configured to receive, from the SRR 810, the control signal associated with the characteristic of the transmission signal. The transmitter 820 further includes a control unit 823 configured to control the transmission signal characteristic adjusting unit 821 to adjust the characteristic of the transmission signal based on the control signal.

In this example, the control signal receiving unit 822 receives, from the control signal transmitting unit 816 of the SRR 810, the control signal associated with the transmission frequency of the transmission signal. The control unit 823 controls the transmission signal characteristic adjusting unit 821 to adjust the transmission frequency of the transmission signal based on the control signal associated with the transmission frequency of the transmission signal. The adjustment of the transmission frequency and the resonance frequency, and the control of the oscillation signal through the adjustment of the transmission frequency and the resonance frequency will be further described with reference to FIG. 9.

The transmitter 820 further includes an oscillator 824 configured to be a frequency source for the transmission signal. The transmitter 820 further includes a power amplifier 825 configured to amplify power of the transmission signal.

Figure 9:
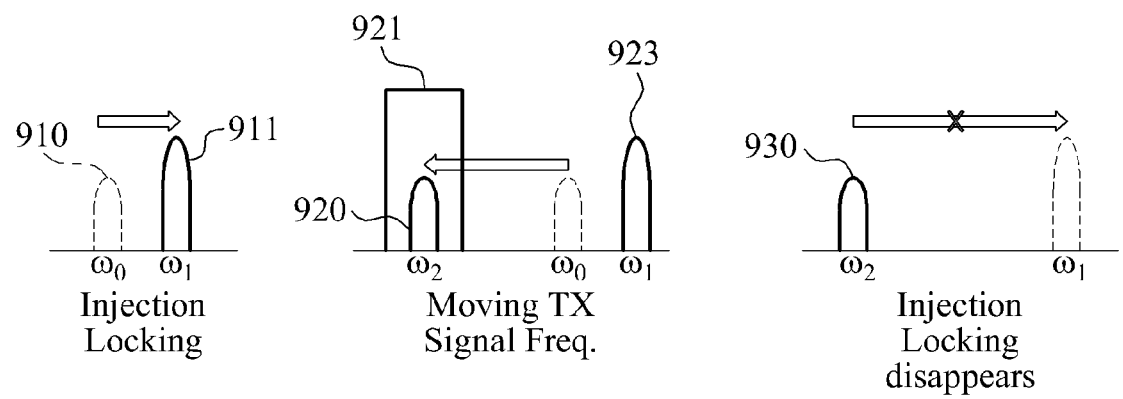
FIG. 9 is a diagram illustrating an example of a process of controlling, by a super-regenerative receiver and a transmitter used in a super-regenerative communication system, an oscillation signal by adjusting a transmission frequency of a transmission signal.

FIG. 9 illustrates an example of a process of controlling, by an SRR and a transmitter used in a super-regenerative communication system, an oscillation signal by adjusting a transmission frequency of a transmission signal. When the SRR receives a transmission signal 910 and an interference signal 911, injection locking or injection pulling may occur. As a result, the SRR may generate and detect an oscillation signal associated with the interference signal 911 of a different frequency band, instead of the transmission signal 910 of a desired frequency band. The SRR may prevent the occurrence of injection locking or injection pulling by instructing the transmitter to adjust a transmission frequency $\omega_0$ of the transmission signal 910, and by adjusting a resonance frequency $\omega_0$ associated with a filtering band of the SRR, in order to generate an oscillation signal associated with the transmission signal 910 of the desired frequency band.

For example, a probability of injection locking or injection pulling occurring may increase according to a decrease in an interval $\Delta\omega$ between a resonance frequency and a center frequency of an interference signal. Accordingly, a control signal transmitting unit (e.g., the control signal transmitting unit 816 in FIG. 8) included in the SRR may transmit, to the transmitter, a control signal instructing to adjust the transmission frequency of the transmission signal transmitted to the transmitter, so that the interval $\Delta\omega$ increases. Also, a control unit (e.g., the control unit 815) included in the SRR may control the resonance frequency adjusting unit to adjust the resonance frequency in order to receive the transmission signal with the adjusted transmission frequency. Further, the transmitter may receive the control signal, and may adjust the transmission frequency of the transmission signal based on the received control signal so that the interval $\Delta\omega$ between the resonance frequency and the center frequency of the interference signal increases.

For example, a determining unit (e.g., the determining unit 814 in FIG. 8) included in the SRR determines that injection locking or injection pulling has occurred based on the interference signal 911 of the frequency band different from the desired frequency band, being detected. The control signal transmitting unit included in the SRR transmits, to the transmitter, the control signal instructing the transmitter to adjust the transmission frequency $\omega_0$ of the transmission signal 910 to a transmission frequency $\omega_2$ of a transmission signal 920, which is further away from a center frequency $\omega_1$ of an interference signal 923. At the same time, the control unit included in the SRR controls the resonance frequency adjusting unit to adjust the resonance frequency $\omega_0$ to a resonance frequency $\omega_2$ so that the transmission signal 920 may be received with the adjusted transmission frequency $\omega_2$. That is, a filtering bandwidth 921 of the SRR using the adjusted resonance frequency $\omega_2$ as a center frequency has been adjusted to be further away from the center frequency $\omega_1$ of the interference signal 923. When an issue of injection locking or injection pulling is solved by the control of the oscillation signal, the SRR generates and detects an oscillation signal 930 associated with the transmission signal 920 of the desired frequency band.

Figure 10:
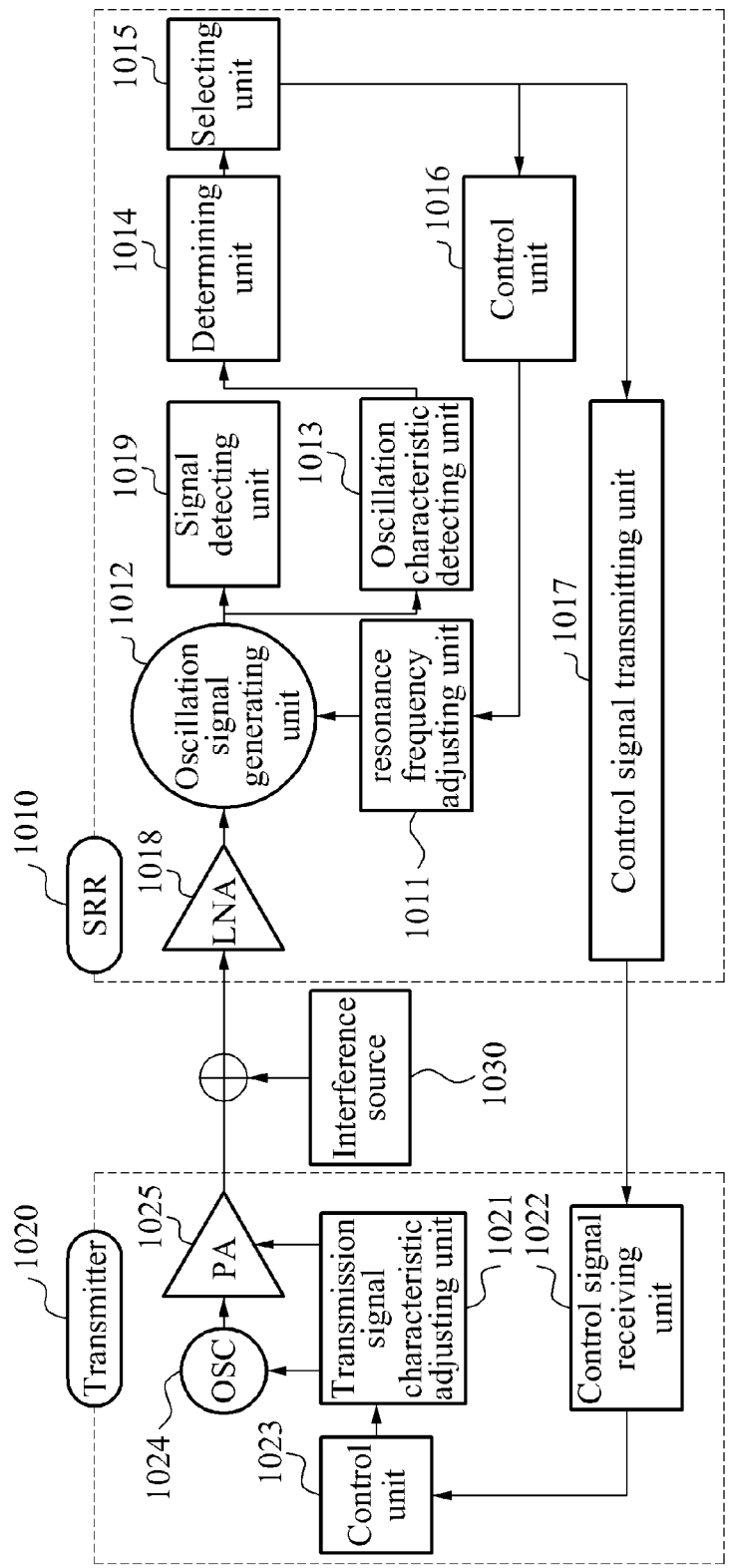
FIG. 10 is a diagram illustrating an example of a super-regenerative receiver and a transmitter used in a super-regenerative communication system, configured to control an oscillation signal by selecting a single scheme from among a plurality of schemes associated with control of the oscillation signal.

FIG. 10 illustrates an example of an SRR 1010 and a transmitter 1020 used in a super-regenerative communication system, configured to control an oscillation signal by selecting a single scheme from among a plurality of schemes associated with control of the oscillation signal. The SRR 1010 includes a resonance frequency adjusting unit 1011 configured to adjust a resonance frequency associated with a filtering band of a transmission signal that is transmitted from the transmitter 1020. The SRR 1010 further includes an oscillation signal generating unit 1012 configured to generate an oscillation signal, using a positive feedback amplification scheme, based on the resonance frequency and the transmission signal. The SRR 1010 further includes an oscillation characteristic detecting unit 1013 configured to detect a characteristic of the oscillation signal. The SRR 1010 further includes a determining unit 1014 configured to determine whether an interference signal from an interference source 1030 is included in the transmission signal based on the characteristic of the oscillation signal and the resonance frequency.

The SRR 1010 further includes an LNA 1018 configured to amplify the transmission signal transmitted from the transmitter 1020, and to provide the amplified signal to the oscillation signal generating unit 1012. The SRR 1010 further includes a signal detecting unit 1019 configured to detect an output signal of the oscillation signal generating unit 1012. Description made above with reference to FIG. 4 may be applied to each of the modules and thus, further description will be omitted here.

The SRR 1010 further includes a selecting unit 1015 configured to select a single scheme from among a plurality of schemes associated with control of the oscillation signal based on, for example, the determination result of the determining unit 1014, the characteristic of the oscillation signal, and/or a control result of the oscillation signal generated by a previous selection of a control scheme. The SRR 1010 further includes a control unit 1016 configured to control the resonance frequency adjusting unit 1011 to adjust the resonance frequency based on the selected scheme. The SRR 1010 further includes a control signal transmitting unit 1017 configured to transmit, to the transmitter 1020, a control signal associated with a characteristic of the transmission signal based on the selected scheme. Here, the characteristic of the transmission signal may include, for example, a strength (e.g., amplitude) of the transmission signal and/or a transmission frequency of the transmission signal.

The selecting unit 1015 receives, from the oscillation characteristic detecting unit 1013 and the determining unit 1014, information including, for example, a frequency interval, the strength of the oscillation signal, an occurrence frequency, and/or the like. The frequency interval is an interval between a resonance frequency of the SRO and a center frequency of an interference signal, for example, $\Delta\omega = \omega_0 - \omega_1$ (referring to FIG. 5). The occurrence frequency is a frequency of occurring injection locking or injection pulling due to an interference signal. The selecting unit 1015 selects the single scheme from among the plurality of schemes associated with the control of the oscillation signal based on the information and a determination that the interference signal is included in the transmission signal. A first scheme (e.g., the scheme described in FIG. 5) is less costly to be applied than a third scheme (e.g., the scheme described in FIG. 9) is, because the third scheme controls both receiver and transmitter. However, the first scheme is less effective for eliminating injection locking/pulling than the third scheme is, in that the first scheme has limited range of adjusting resonance frequency. For example, the transmitter of the first scheme does not change a frequency of a transmission signal. As shown in FIG. 5, the filtering bandwidth 530 of the SRR (e.g., RX SRO) using the adjusted resonance frequency $\omega_0 - \Delta\omega$ as a center frequency has been adjusted to be further away from the center frequency $\omega_1$ of the interference signal 532. Even after adjusting resonance frequency $\omega_0 - \Delta\omega$, a frequency of the signal 531 should be included in the filtering bandwidth 530 of the receiver. Thus, the first scheme has limited range of adjusting resonance frequency. On the other hand, the third scheme does not have such a limitation, because the third scheme controls both a transmission frequency of the transmitter and a resonance frequency of the receiver. Consequently, the selecting unit 1015 determines, based on $\Delta\omega$, whether or not the first scheme eliminates injection locking/pulling. The selecting unit 1015 selects the single scheme from among the plurality of schemes based on the determination result. In more detail, the selecting unit 1015 selects the first scheme when $\Delta\omega$ is large enough to eliminate injection locking/pulling by applying the first scheme. In case that $\Delta\omega$ is not large enough to eliminate injection locking/pulling by applying the first scheme, the selecting unit 1015 selects the third scheme.

The selecting unit 1015 selects no scheme when the occurrence frequency is lower than a predetermined first value relating to QoS. Moreover, the selecting unit 1015 selects the first scheme (e.g., the scheme described in FIG. 5), which has lowest cost or tradeoff to be applied, when the occurrence frequency is higher than the first value, but the occurrence frequency is lower than a predetermined second value. In case that the occurrence frequency is higher than the second value and lower than a predetermined third value, the selecting unit 1015 selects a second scheme (e.g., the scheme described in FIG. 7), which has middle cost or tradeoff to be applied. When the occurrence frequency is even higher than the third value, the selecting unit 1015 selects the third scheme (e.g., the scheme described in FIG. 9), which has highest cost or tradeoff to be applied. Also, the selecting unit 1015 may select the single scheme from among the plurality of schemes based on whether performance of the SRR 1010 is enhanced, for example, whether the oscillation signal is controlled as desired by applying the single scheme. In yet another example, the selecting unit 1015 may select the single scheme from among the plurality of schemes based on whether performance of the SRR 1010 has been enhanced by the single scheme, for example, whether the oscillation signal has been controlled as desired by applying the previously-selected single scheme.

The plurality of schemes may include, for example, a self-adaptation scheme of using only control of the SRR 1010 (e.g., the resonance frequency of the SRR 1010), and an active adaptation scheme of using the control of the SRR 1010 and control of the transmitter 1020 (e.g., the strength and/or the transmission frequency of the transmission signal). Here, the selecting unit 1015 may select the single scheme from among the plurality of schemes by further employing a cost (e.g., processing cost) of applying each scheme associated with control of the oscillation signal. For example, the self-adaptation scheme may be relatively less costly compared to the active-adaptation scheme. In this example, the control unit 1016 included in the SRR 1010 may attempt to control the oscillation signal by initially selecting the self-adaptation scheme. When the oscillation signal is not controlled using the selected self-adaptation scheme, the control unit 1016 may attempt to control the oscillation signal again by selecting the active-adaptation scheme of greater cost.

In a first scheme among the plurality of schemes, the control unit 1016 may control the resonance frequency adjusting unit 1011 to adjust the resonance frequency. In a second scheme among the plurality of schemes, the control signal transmitting unit 1017 may transmit, to the transmitter 1020, the control signal associated with the strength of the transmission signal. In a third scheme among the plurality of schemes, the control signal transmitting unit 1017 may transmit, to the transmitter 1020, the control signal associated with the transmission frequency of the transmission signal, and the control unit 1016 may control the resonance frequency adjusting unit 1011 to adjust the resonance frequency. In these examples, the first scheme may be the self-adaptation scheme, and the second scheme and the third scheme may be active-adaptation schemes.

Description made above with reference to FIG. 4 and FIG. 5 may be applied to each of the modules used for the first scheme, description made above with reference to FIG. 6 and FIG. 7 may be applied to each of the modules used for the second scheme, and description made above with reference to FIG. 8 and FIG. 9 may be applied to each of the modules used for the third scheme. Accordingly, further detailed description will be omitted here.

The transmitter 1020 includes a transmission signal characteristic adjusting unit 1021 configured to adjust the characteristic of the transmission signal. The transmitter 1020 further includes a control signal receiving unit 1022 configured to receive, from the SRR 1010, the control signal associated with the characteristic of the transmission signal. The transmitter 1020 further includes a control unit 1023 configured to control the transmission signal characteristic adjusting unit 1021 to adjust the characteristic of the transmission signal based on the control signal. Here, the characteristic of the transmission signal may include, for example, the strength of the transmission signal and the transmission frequency of the transmission signal.

The transmitter 1020 further includes an oscillator 1024 configured to be a frequency source for the transmission signal. The transmitter 1020 further includes a power amplifier 1025 configured to amplify power of the transmission signal. Description made above with reference to FIG. 6 through FIG. 9 may be applied to each of the modules included in the transmitter 1020, and thus, further description will be omitted here.

Figure 11:
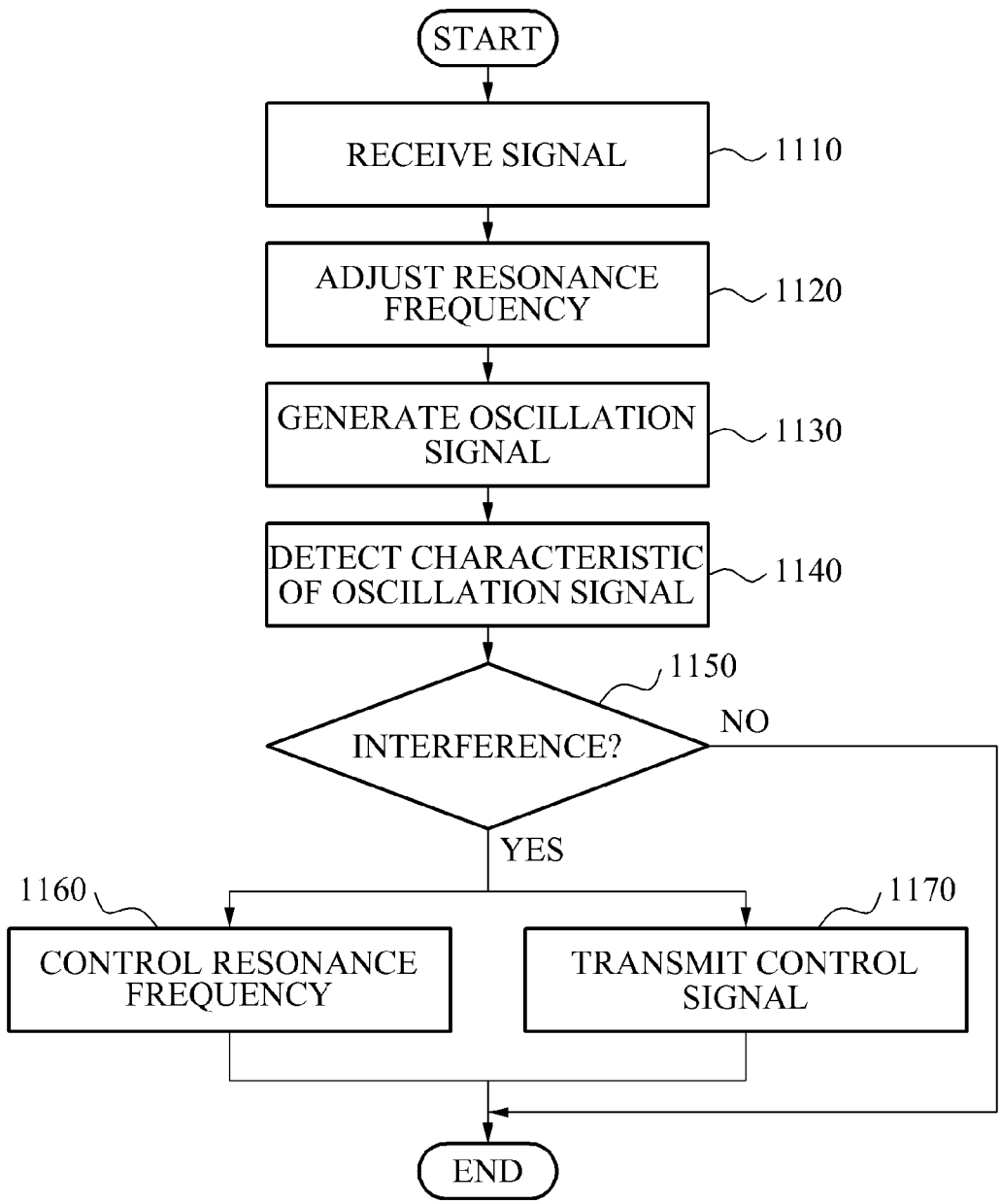
FIG. 11 is a flowchart illustrating an example of a method of controlling, by a super-generative receiver, an oscillation signal by adjusting a transmission signal or a resonance frequency.

FIG. 11 illustrates an example of a method of controlling, by an SRR, an oscillation signal by adjusting a transmission signal or a resonance frequency. At step 1110, a signal (e.g., transmission signal) is received from a transmitter. At step 1120, a resonance frequency associated with a filtering band of the transmission signal is adjusted. At step 1130, an oscillation signal is generated, using a positive feedback amplification scheme, based on the resonance frequency and the transmission signal. At step 1140, a characteristic of the oscillation signal is detected. At step 1150, whether interference is included in the transmission signal is determined based on the characteristic of the oscillation signal and the resonance frequency. If interference is included, the method continues at step 1160 or step 1170. Otherwise, the method ends.

At step 1160, the resonance frequency is controlled based on the determination result of step 1150. In 1170, a control signal associated with a characteristic of a transmission signal is transmitted to the transmitter based on the determination result of step 1150. Here, the characteristic of the transmission signal may include, for example, a strength (e.g., amplitude) of the transmission signal and/or a transmission frequency of the transmission signal. Description made above with reference to FIG. 1 through FIG. 10 may be applied to the oscillation signal controlling method of FIG. 11, and thus, further detailed description will be omitted here.

Figure 12:
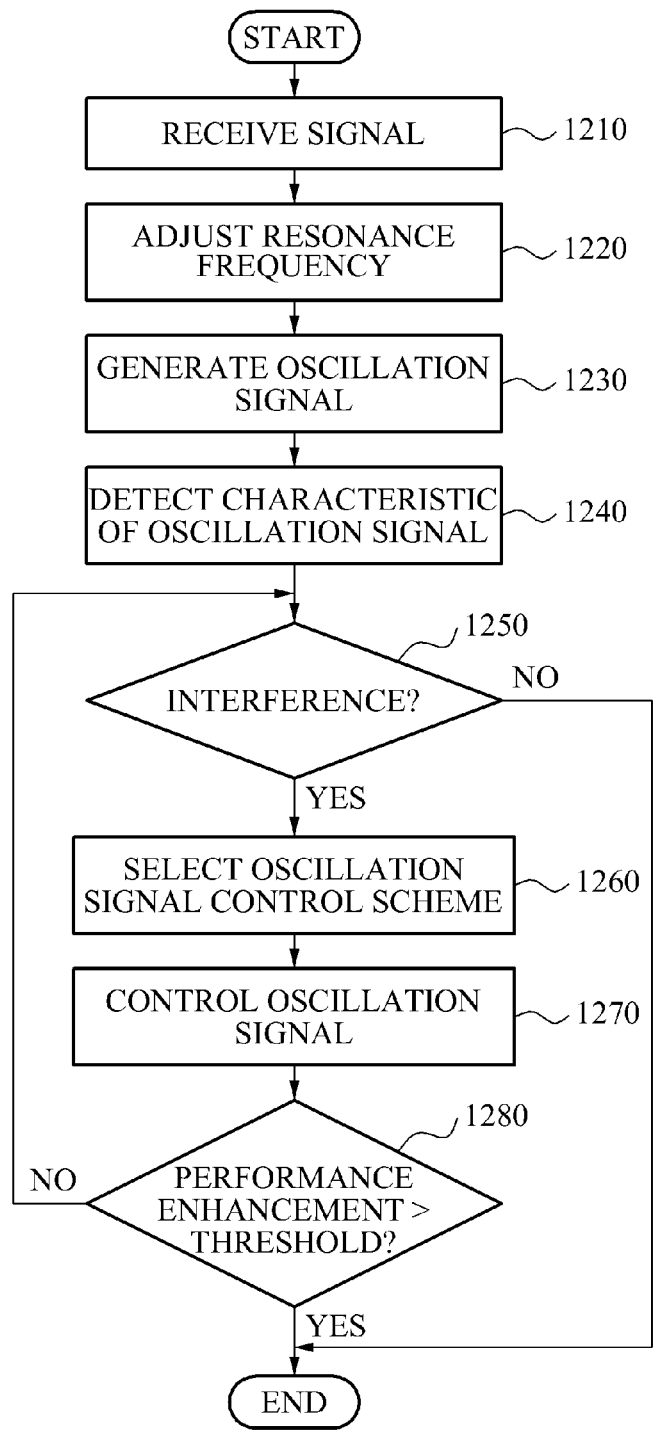
FIG. 12 is a flowchart illustrating an example of a method of controlling, by a super-regenerative receiver and a transmitter used in a super-regenerative communication system, an oscillation signal by selecting a single scheme from among a plurality of schemes associated with control of the oscillation signal.

FIG. 12 illustrates an example of a method of controlling, by an SRR, an oscillation signal by selecting a single scheme from a plurality of schemes associated with control of the oscillation signal. At step 1210, a signal (e.g., transmission signal) is received from a transmitter. At step 1220, a resonance frequency associated with a filtering band of the transmission signal is adjusted. At step 1230, an oscillation signal is generated, using a positive feedback amplification scheme, based on the resonance frequency and the transmission signal. At step 1240, a characteristic of the oscillation signal is detected. At step 1250, whether interference is included in the transmission signal is determined based on the characteristic of the oscillation signal and the resonance frequency. If interference is included, the method continues at step 1260. Otherwise, the method ends.

At step 1260, a single oscillation signal control scheme is selected from among a plurality of oscillation signal control schemes based on the determination result of step 1250, the characteristic of the oscillation signal, and/or a control result of the oscillation signal generated by a previous selection of an oscillation signal control scheme. At step 1270, the oscillation signal is controlled using the selected scheme. The plurality of oscillation signal control schemes may include, for example, a scheme of adjusting the resonance frequency, a scheme of transmitting a control signal associated with a strength of the transmission signal to the transmitter, and/or a scheme of transmitting a control signal associated with a transmission frequency of the transmission signal to the transmitter and adjusting the resonance frequency.

At step 1280, it is determined whether a performance enhancement of the SRR due to the selected scheme, is greater than a predetermined threshold, e.g., whether the oscillation signal is controlled as desired by applying the selected scheme. If the performance enhancement is not greater than the threshold, the method returns to step 1250. Otherwise, the method ends. Description made above with reference to FIG. 1 through FIG. 10 may be applied to the oscillation signal controlling method of FIG. 12 and thus, further detailed description will be omitted here.

Figure 13:
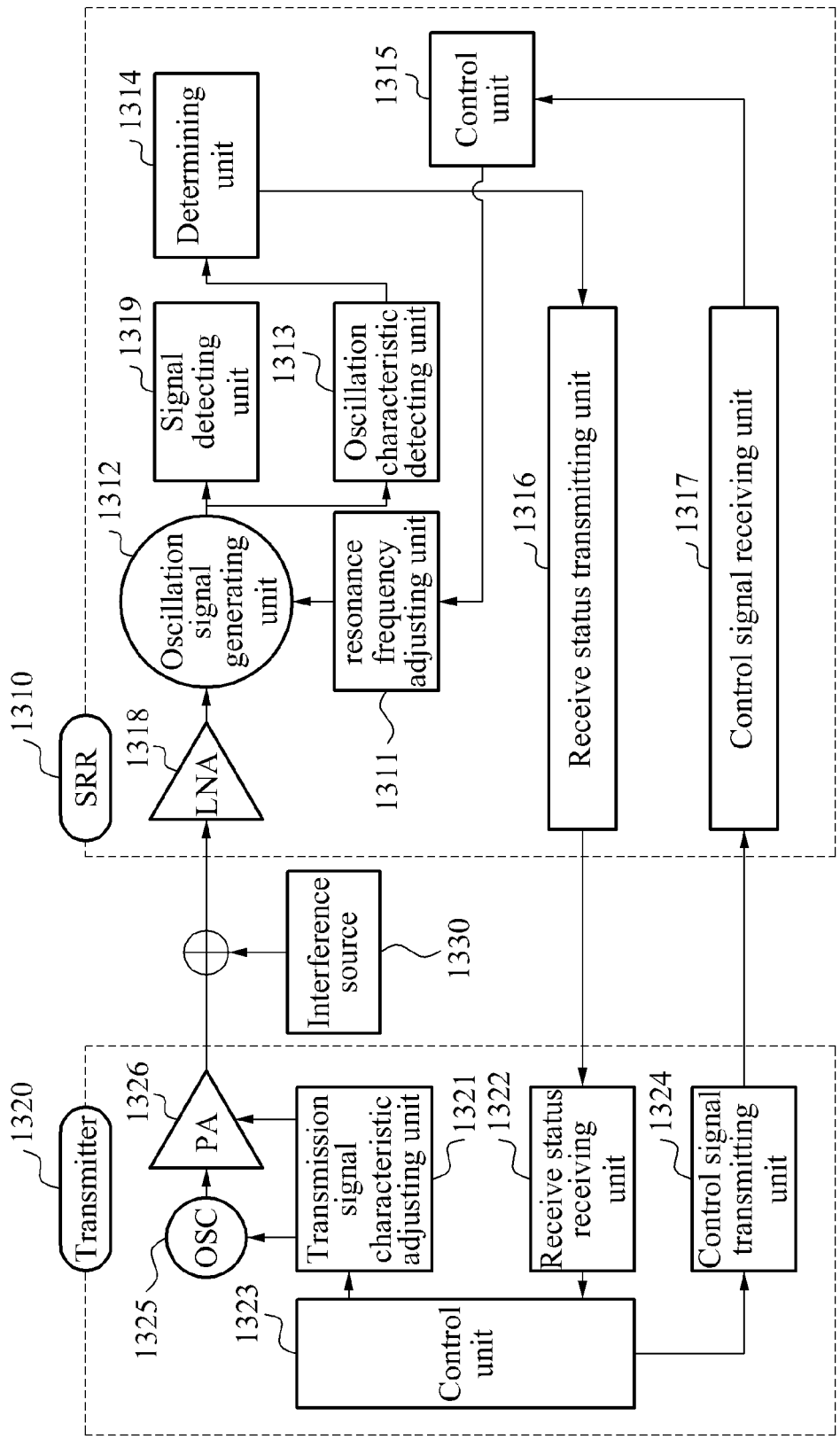
FIG. 13 is a diagram illustrating an example of a super-regenerative receiver and a transmitter used in a super-regenerative communication system, configured to control an oscillation signal based on information associated with a receive status transmitted from the super-regenerative receiver.

FIG. 13 illustrates an example of an SRR 1310 and a transmitter 1320 used in a super-regenerative communication system, configured to control an oscillation signal based on information associated with a receive status transmitted from the SRR 1310. The SRR 1310 includes a resonance frequency adjusting unit 1311 configured to adjust a resonance frequency associated with a filtering band of a transmission signal that is transmitted from the transmitter 1320. The SRR 1310 further includes an oscillation signal generating unit 1312 configured to generate an oscillation signal, using a positive feedback amplification scheme, based on the resonance frequency and the transmission signal. The SRR 1310 further includes an oscillation characteristic detecting unit 1313 configured to detect a characteristic of the oscillation signal. The SRR 1310 further includes a determining unit 1314 configured to determine whether an interference signal from an interference source 1330 is included in the transmission signal based on the characteristic of the oscillation signal and the resonance frequency.

The SRR 1310 further includes an LNA 1318 configured to amplify the transmission signal transmitted from the transmitter 1320, and to provide the amplified signal to the oscillation signal generating unit 1312. The SRR 1310 further includes a signal detecting unit 1319 configured to detect an output signal of the oscillation signal generating unit 1312. Description made above with reference to FIG. 4 may be applied to each of the modules, and thus, further description will be omitted here.

The transmitter 1320 includes a transmission signal characteristic adjusting unit 1321 configured to adjust the characteristic of the transmission signal. The transmitter 1320 further includes an oscillator 1325 configured to be a frequency source for the transmission signal, and a power amplifier 1326 configured to amplify power of the transmission signal. Description made above with reference to FIG. 6 through FIG. 9 may be applied to each of the modules, and thus, further description will be omitted here.

The SRR 1310 further includes a receive status transmitting unit 1316 configured to transmit, to the transmitter 1320, information associated with a receive status of the SRR 1310 based on the determination result of the determining unit 1314. Here, the information associated with the receive status may include, for example, the resonance frequency set by the resonance frequency adjusting unit 1311, an oscillation frequency of the oscillation signal detected by the oscillation characteristic detecting unit 1313, a strength (e.g., amplitude) of the oscillation signal detected by the oscillation characteristic detecting unit 1313, and/or the like.

In this example, the transmitter 1320 includes a receive status receiving unit 1322 configured to receive, from the SRR 1310, the information associated with the receive status. The transmitter 1320 further includes a control unit 1323 configured to control the transmission signal characteristic adjusting unit 1321 to adjust the characteristic of the transmission signal based on the information associated with the receive status.

For example, a probability of injection locking or injection pulling occurring may increase according to a decrease in a ratio of a strength of a signal with a desired frequency band to a strength of an interference signal, for example, a SIR. Therefore, to increase the SIR, the control unit 1323 may control the transmission signal characteristic adjusting unit 1321 to increase the strength of the transmission signal transmitted from the transmitter 1320. Description made above with reference to FIG. 7 may be applied to the adjustment of the transmission signal strength and the control of the oscillation signal through the adjustment of the transmission signal strength, and thus, further description will be omitted here.

The transmitter 1320 further includes a control signal transmitting unit 1324 configured to transmit, to the SR 1310, a control signal associated with the characteristic of the transmission signal. The control unit 1323 controls the control signal transmitting unit 1324 to transmit the control signal associated with the characteristic of the transmission signal.

In this example, the SRR 1310 further includes a control signal receiving unit 1317 configured to receive, from the transmitter 1320, the control signal associated with the characteristic of the transmission signal. The SRR 1310 further includes a control unit 1315 configured to control the resonance frequency adjusting unit 1311 to adjust the resonance frequency based on the control signal.

For example, a probability of injection locking or injection pulling occurring may increase according to a decrease in an interval between a resonance frequency of an SRO and a center frequency of an interference signal, for example, $\Delta\omega = \omega_0 - \omega_1$. Accordingly, the control unit 1323 may control the control signal transmitting unit 1324 to transmit, to the SRR 1310, a control signal instructing the SRR 1310 to adjust the resonance frequency of the SRR 1310, so that $\Delta\omega$ increases. In this example, the control unit 1315 may control the resonance frequency adjusting unit 1311 to adjust the resonance frequency of the SRO, so that the interval $\Delta\omega$ between the resonance frequency of the SRO and a center frequency of the interference signal increases. Description made above with reference to FIG. 5 may be applied to the adjustment of the resonance frequency and the control of the oscillation signal through the adjustment of the resonance frequency, and thus, further detailed description will be omitted here.

In addition, the control unit 1323 may control the transmission signal characteristic adjusting unit 1321 to adjust a transmission frequency of the transmission signal, so that $\Delta\omega$ increases. In this example, the control unit 1323 may control the control signal transmitting unit 1324 to transmit, to the SRR 1310, a control signal instructing the SRR 1310 to adjust the resonance frequency of the SRR 1310, so that the resonance frequency matches the adjusted transmission frequency. Here, the control unit 1315 may control the resonance frequency adjusting unit 1311 to adjust the resonance frequency in order to receive the transmission signal with the adjusted transmission frequency. Description made above with reference to FIG. 9 may be applied to the adjustment of the transmission frequency and the resonance frequency, and the control of the oscillation signal through the adjustment of the transmission frequency and the resonance frequency, and thus, further detailed description will be omitted here.

The control unit 1323 may select a single scheme from among a plurality of schemes associated with the control of the oscillation signal based on the information associated with the receive status. Also, the control unit 1323 may select the single scheme from among the plurality of schemes based on whether performance of the SRR 1310 is enhanced, for example, whether the oscillation signal is controlled as desired by applying the single scheme. Here, description made above with reference to FIG. 10 may be applied to the plurality of schemes, and thus, further detailed description will be omitted here.

The units described herein may be implemented using hardware components and software components. For example, the hardware components may include microphones, amplifiers, band-pass filters, audio to digital convertors, and processing devices. A processing device may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such a parallel processors.

The software may include a computer program, a piece of code, an instruction, or some combination thereof, for independently or collectively instructing or configuring the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. In particular, the software and data may be stored by one or more computer readable recording mediums. The computer readable recording medium may include any data storage device that can store data which can be thereafter read by a computer system or processing device. Examples of the non-transitory computer readable recording medium include read-only memory (ROM), random-access memory (RAM), CD-ROMs, magnetic tapes, floppy disks, optical data storage devices. Also, functional programs, codes, and code segments for accomplishing the example embodiments disclosed herein can be easily construed by programmers skilled in the art to which the embodiments pertain based on and using the flow diagrams and block diagrams of the figures and their corresponding descriptions as provided herein.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A regenerative receiver comprising:
   an adjuster configured to adjust a resonance frequency associated with a filtering band of a transmission signal that is received from a transmitter;
   a generator configured to generate an oscillation signal based on the resonance frequency and the transmission signal;
   a detector configured to detect a characteristic of the oscillation signal; and
   a determiner configured to determine whether interference is included in the transmission signal based on the characteristic of the oscillation signal and the resonance frequency.

2. The regenerative receiver of claim 1, further comprising at least one of:
   a controller configured to control the adjuster to adjust the resonance frequency based on a determination result of the determiner; and
   a control signal transmitter configured to transmit, to the transmitter, a control signal associated with a characteristic of the transmission signal based on a determination result of the determiner.

3. The regenerative receiver of claim 2, wherein the characteristic of the transmission signal comprises at least one of a strength of the transmission signal and a transmission frequency of the transmission signal.

4. The regenerative receiver of claim 1, further comprising:
   a selector configured to select a scheme from among schemes associated with control of the oscillation signal based on a determination result of the determiner, or the characteristic of the oscillation signal, or a control result of the oscillation signal generated by a previous selection of one of the schemes, or any combination thereof;
   a controller configured to control the adjuster to adjust the resonance frequency based on the scheme; and
   a control signal transmitter configured to transmit, to the transmitter, a control signal associated with a characteristic of the transmission signal based on the scheme.

5. The regenerative receiver of claim 4, wherein:
   in a first scheme among the schemes, the controller is further configured to control the adjuster to adjust the resonance frequency;
   in a second scheme among the schemes, the control signal transmitter is further configured to transmit, to the transmitter, the control signal associated with a strength of the transmission signal; and
   in a third scheme among the schemes, the control signal transmitter is further configured to transmit, to the transmitter, the control signal associated with a transmission frequency of the transmission signal, and the controller is further configured to control the adjuster to adjust the resonance frequency.

6. The regenerative receiver of claim 1, wherein the characteristic of the oscillation signal comprises a frequency of the oscillation signal, or a type of the oscillation signal, or a strength of the oscillation signal at a point in time in which a predetermined period of time is elapsed after an oscillation starts, or any combination thereof.

7. The regenerative receiver of claim 1, wherein to determine whether the interference is included in the transmission signal, the determiner is further configured to determine whether injection locking or injection pulling occurs based on the resonance frequency and a frequency of the oscillation signal.

8. The regenerative receiver of claim 1, wherein the generator comprises:
   a resonator configured to generate a first oscillation signal;
   an amplifier configured to amplify the first oscillation signal based on an amplification gain of the amplifier and; and
   a second adjuster configured to adjust the amplification gain,
   wherein the resonator is further configured to generate a second oscillation signal based on the resonance frequency, the transmission signal, and the amplified first oscillation signal.

9. The regenerative receiver of claim 1, further comprising:
   a receive status transmitter configured to transmit, to the transmitter, information associated with a receive status of the regenerative receiver based on a determination result of the determiner.

10. The regenerative receiver of claim 1, further comprising:
    a receiver configured to receive, from the transmitter, a control signal associated with a characteristic of the transmission signal; and
    a controller configured to control the adjuster to adjust the resonance frequency based on the control signal.

11. A method of controlling an oscillation signal in a regenerative receiver, the method comprising:
    receiving, from a transmitter, a transmission signal;
    adjusting a resonance frequency associated with a filtering band of the transmission signal;
    generating an oscillation signal based on the resonance frequency and the transmission signal;
    detecting a characteristic of the oscillation signal; and
    determining whether interference is included in the transmission signal based on the characteristic of the oscillation signal and the resonance frequency.

12. The method of claim 11, further comprising at least one of:
    controlling the resonance frequency based on the determining of whether the interference is included; and
    transmitting, to the transmitter, a control signal associated with a characteristic of the transmission signal based on the determining of whether the interference is included.

13. The method of claim 12, wherein the characteristic of the transmission signal comprises at least one of a strength of the transmission signal and a transmission frequency of the transmission signal.

14. The method of claim 11, further comprising:
    selecting a scheme from among schemes associated with control of the oscillation signal based on the determining of whether the interference is included, or the characteristic of the oscillation signal, or a control result of the oscillation signal generated by a previous selection of one of the schemes, or any combination thereof; and
    controlling the oscillation signal based on the scheme.

15. The method of claim 14, wherein the schemes comprise a scheme of adjusting the resonance frequency, a scheme of transmitting, to the transmitter, a control signal associated with a strength of the transmission signal, and a scheme of transmitting, to the transmitter, a control signal associated with a transmission frequency of the transmission signal and adjusting the resonance frequency.

16. The method of claim 11, wherein the characteristic of the oscillation signal comprises a frequency of the oscillation signal, or a type of the oscillation signal, or a strength of the oscillation signal at a point in time in which a predetermined period of time is elapsed after an oscillation starts, or any combination thereof.

17. The method of claim 11, the determining comprises:
determining whether injection locking or injection pulling occurs based on the resonance frequency and a frequency of the oscillation signal.

18. The method of claim 11, further comprising:
transmitting, to the transmitter, information associated with a receive status of the regenerative receiver based on the determining of whether the interference is included.

19. The method of claim 11, further comprising:
receiving, from the transmitter, a control signal associated with a characteristic of the transmission signal; and
adjusting the resonance frequency based on the control signal.

20. A non-transitory computer-readable storage medium storing a program comprising instructions to cause a computer to perform the method of claim 11.

* * * * *